(12) United States Patent
Takimoto

(10) Patent No.: US 8,384,166 B2
(45) Date of Patent: Feb. 26, 2013

(54) METHOD FOR MANUFACTURING SEMICONDUCTOR DEVICE AND SEMICONDUCTOR DEVICE

(75) Inventor: Kaori Takimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/476,507

(22) Filed: Jun. 2, 2009

(65) Prior Publication Data
US 2010/0006955 A1  Jan. 14, 2010

(30) Foreign Application Priority Data

Jul. 9, 2008  (JP) ................................. 2008-178837

(51) Int. Cl.
*H01L 29/78* (2006.01)
*H01L 21/336* (2006.01)
*H01L 21/28* (2006.01)
(52) U.S. Cl. ............... 257/407; 257/E21.444; 438/595; 438/926
(58) Field of Classification Search .............. 438/585, 438/926, 589, 595; 257/407, E21.444
See application file for complete search history.

(56) References Cited

U.S. PATENT DOCUMENTS

| 6,586,808 B1 * | 7/2003 | Xiang et al. ................ 257/407 |
| 6,893,927 B1 * | 5/2005 | Shah et al. ................... 438/287 |
| 7,176,090 B2 * | 2/2007 | Brask et al. .................. 438/270 |
| 7,208,797 B2 * | 4/2007 | Yagishita et al. ............ 257/330 |
| 7,217,644 B2 * | 5/2007 | Doyle et al. ................. 438/592 |
| 7,585,716 B2 * | 9/2009 | Cheng ........................... 438/183 |
| 7,790,559 B2 * | 9/2010 | Adkisson et al. ............. 438/287 |
| 7,812,411 B2 * | 10/2010 | Cheng .......................... 257/410 |
| 8,048,790 B2 * | 11/2011 | Soss et al. .................... 438/585 |
| 8,227,874 B2 * | 7/2012 | Adkisson et al. ............. 257/411 |
| 2002/0000623 A1 * | 1/2002 | Cho et al. ..................... 257/388 |
| 2002/0155665 A1 * | 10/2002 | Doris et al. ................... 438/279 |

(Continued)

FOREIGN PATENT DOCUMENTS

| JP | 10-050986 | 2/1998 |
| JP | 2002-110989 | 4/2002 |

(Continued)

OTHER PUBLICATIONS

Yamaguchi et al., "High Performance Dual Metal Gate with High Mobility and Low Threshold Voltage Applicable to Bulk CMOS Technology" [ 2006 Symposium on VLSI Technology Digest of Technical Papers] IEEE 2006, pp. 192.

*Primary Examiner* — Mary Wilczewski
(74) *Attorney, Agent, or Firm* — Robert J. Depke; The Chicago Technology Law Group, LLC

(57) ABSTRACT

A semiconductor device manufacturing method includes the steps of: successively forming, on a semiconductor substrate, a gate insulating film and first and second dummy sections stacked in this order; forming a notch section by processing the gate insulating film and the first and second dummy gate sections into a previously set pattern and making the first dummy gate section move back in the gate length direction relative to the second dummy gate section; forming a side wall of an insulating material in a side part of each of the gate insulating film and the first and second dummy gate sections and embedding the notch section therewith; removing the first and second dummy gate sections to leave the gate insulating film and the notch section in the bottom of a removed portion; and forming a gate electrode made of a conductive material by embedding the removed portion with the conductive material.

8 Claims, 4 Drawing Sheets

| U.S. PATENT DOCUMENTS | | | |
|---|---|---|---|
| 2003/0235943 A1* | 12/2003 | Trivedi | 438/197 |
| 2004/0175910 A1* | 9/2004 | Pan et al. | 438/592 |
| 2005/0224880 A1* | 10/2005 | Lee et al. | 257/347 |
| 2005/0269644 A1* | 12/2005 | Brask et al. | 257/369 |
| 2005/0272191 A1* | 12/2005 | Shah et al. | 438/197 |
| 2006/0006522 A1* | 1/2006 | Doczy et al. | 257/702 |
| 2009/0206406 A1* | 8/2009 | Rachmady et al. | 257/365 |
| 2012/0043623 A1* | 2/2012 | Doris et al. | 257/410 |

| FOREIGN PATENT DOCUMENTS | | |
|---|---|---|
| JP | 2002-164537 | 6/2002 |
| JP | 2002-270835 | 9/2002 |
| JP | 2002-289841 | 10/2002 |
| JP | 2003-017690 | 1/2003 |
| JP | 2007-134432 | 5/2007 |
| WO | WO-03/088365 | 10/2003 |

* cited by examiner

METHOD FOR MANUFACTURING SEMICONDUCTOR DEVICE AND SEMICONDUCTOR DEVICE

The present application contains subject matter related to that disclosed in Japanese priority Patent Application JP 2008-178837 filed in the Japan Patent Office on Jul. 9, 2008, the entire content of which is hereby incorporated by reference.

BACKGROUND OF THE INVENTION

1. Field of the Invention

The present invention relates to a method for manufacturing a semiconductor device and a semiconductor device. In particular, the present invention relates to a semiconductor technology including transistors having a gate electrode and a gate insulating film.

2. Description of the Related Art

High integration and high speed of a transistor have been realized by means of microfabrication of the transistor on the basis of the scaling law. In general, though polysilicon/SiON and $SiO_2$ are used as a gate stack material of a gate electrode/gate insulating film of a transistor, it has become difficult to make the gate insulating film thin due to an electrical reason. Then, the "high-k/metal gate technology" which is a combination of a high dielectric constant (high-k) gate insulating film and a metal gate electrode attracts attention.

In the case where a metal gate electrode is applied for bulk CMOS (complementary MOS), in order to make it possible to control a threshold value by implanting impurities into channels, metal materials having a different work function from each other are used in an n-type MOS transistor (nMOS) and a p-type MOS transistor (pMOS). Such a gate structure is also called a "dual metal gate structure". Specifically, in the case of nMOS, a metal material having a work function in the vicinity of a conduction band end of silicon is used, and in the case of pMOS, a metal material having a work function in the vicinity of a valence electron band end is used.

However, in the case where the foregoing "dual metal gate structure" is formed in a usual gate forming process, there is included the following fault. That is, when after forming a metal gate electrode, a high-temperature heat treatment such as annealing is carried out for the purpose of achieving activation, the effective work function of a stack gate composed of a high dielectric constant gate insulting film and a metal gate electrode changes. For that reason, it is difficult to obtain a work function in the vicinity of a desired band end.

Then, there is reported a process in which a dummy gate section is first formed, and after removing this dummy gate section, a gate electrode is formed therein (this process will be hereinafter referred to as "gate-last process") (see Non-Patent Document 1: Shinpei Yamaguchi, et al., "High Performance Dual Metal Gate with High Mobility and Low Threshold Voltage Applicable to Bulk CMOS Technology" in 2006 *Symposium on VLSI Tehcnology Digest of Technical Papers*, IEEE, 2006, page 192). In the gate-last process, integration of a dual metal is realized, and very good device characteristics can be obtained. In particular, in the case of the gate-last process, after fabricating a metal material for the purpose of controlling the work function, a device can be formed in a low-temperature process. For that reason, it becomes possible to control an effective work function of the foregoing stack gate in the vicinity of a band end.

SUMMARY OF THE INVENTION

However, in the gate forming method of the gate-last process disclosed in Non-Patent Document 1, after removing the dummy gate section, a high dielectric constant material film is formed in the removed portion, and a conductive material is further embedded therein to form a gate electrode. For that reason, there is produced a state in which the high dielectric constant material film constituting a high dielectric constant gate insulating film is widely formed over from a lower part to a side part of the gate electrode. For that reason, there are involved such problems that the fringe capacity increases and that the metal-embedded portion becomes narrow, whereby increasing the gate resistance. Also, in the case of forming a gate electrode in the gate-last process, when the gate length is made short for the purpose of contriving to enhance characteristics of a transistor (for example, realization of high speed or low power consumption, etc.), an aspect ratio of the electrode-embedded portion becomes high, whereby embedding properties are deteriorated. The "gate length" as referred to herein means a length of a portion where the gate electrode and the gate insulating film come into physical contact with each other.

Thus, it is desirable to provide a construction capable of not only reducing the fringe capacity and gate resistance of a transistor but shortening the effective gate length, thereby contriving to enhance characteristics of the transistor.

According to an embodiment of the present invention, there is provided a method for manufacturing a semiconductor device including the steps of forming, on a semiconductor substrate, a gate insulating film, a first dummy gate section and a second dummy section stacked in this order; forming a notch section by processing the gate insulating film, the first dummy gate section and the second dummy gate section into a previously set pattern and making the first dummy gate section move back in the gate length direction relative to the second dummy gate section; forming a side wall made of an insulating material in a side part of each of the gate insulating film, the first dummy gate section and the second dummy gate section and embedding the notch section with the insulating material; removing the first dummy gate section and the second dummy gate section to leave the gate insulating film and the notch section in the bottom of a removed portion; and forming a gate electrode made of a conductive material by embedding the removed portion with the conductive material.

In the method for manufacturing a semiconductor device according to the embodiment of the present invention, the inner surface of the side wall is allowed to be exposed in the removed portion when the first dummy gate section and the second dummy gate section are removed. For that reason, an aspect ratio at the time of embedding an electrode is low as compared with the case where the inner surface of the side wall is covered by a gate insulating film. Also, there is produced a state in which in embedding the foregoing removed portion with a conductive material to form a gate electrode, a gate insulating film does not exist in a boundary portion between the gate electrode and the side wall but exists only in a lower part of the gate electrode. Also, there is produced a state in which a lower end section of the gate electrode is diameter-reduced in the gate length direction due to the presence of the notch section.

According to another embodiment of the present invention, there is provided a semiconductor device including a gate insulating film formed on a semiconductor substrate; a gate electrode on the gate insulating film; and a side wall formed in a state of coming into contact with the gate electrode in a side part of the gate electrode, wherein the gate insulating film is formed beneath the gate electrode in the same width as a gap between the side walls facing each other in the gate length direction so as to interpose the gate electrode therebetween; and the gate electrode has a restricted section which is narrower than the gap between the side walls in the gate length direction in a lower end section of the gate electrode and comes into contact with the gate insulating film in the same width as the restricted section.

In the semiconductor device according to the embodiment of the present invention, the side wall is formed in a state of coming into contact with the side part of the gate electrode, and the gate insulating film is formed beneath of the gate electrode. For that reason, the fringe capacity and gate resistance of a transistor are low as compared with the case of forming a gate insulating film over from a lower part to a side part of the gate electrode. Also, since the gate electrode comes into contact with the gate insulating film in the same width as the restricted section provided in the lower end section thereof, the effective gate length is short as compared with the case where no restricted section is provided.

According to the embodiments of the present invention, not only the fringe capacity and gate resistance of a transistor can be reduced, but the effective gate length can be made short so that it is possible to contrive to enhance characteristics of the transistor.

DESCRIPTION OF THE PREFERRED EMBODIMENTS

Specific modes according to embodiments of the present invention are hereunder described in detail with reference to the accompanying drawings. The technical scope of the present invention is not limited to the modes described below, but it should be construed that various changes and modifications are also included within the range from which specified effects obtained by constituent features of the present invention and combinations thereof can be derived.

FIGS. 1A and 1B to FIGS. 4A and 4B are each a process diagram showing a method for manufacturing a semiconductor device according to an embodiment of the present invention. A semiconductor device to which an embodiment of the present invention is objective for the manufacture is broadly a semiconductor device including a field effect transistor (FET), more specifically a semiconductor device including a MOS transistor, and further specifically a semiconductor device including a CMOS transistor. The term "MOS" is originally a term combining the initials of "Metal-Oxide-Semiconductor" and means a stacked structure of metal/oxide/semiconductor. However, in this specification, the term "MOS" means not only a stacked structure of metal/oxide/semiconductor but a stacked structure of conductor/insulator/semiconductor, the sense of which is broader than that of the former.

Figure 1A:
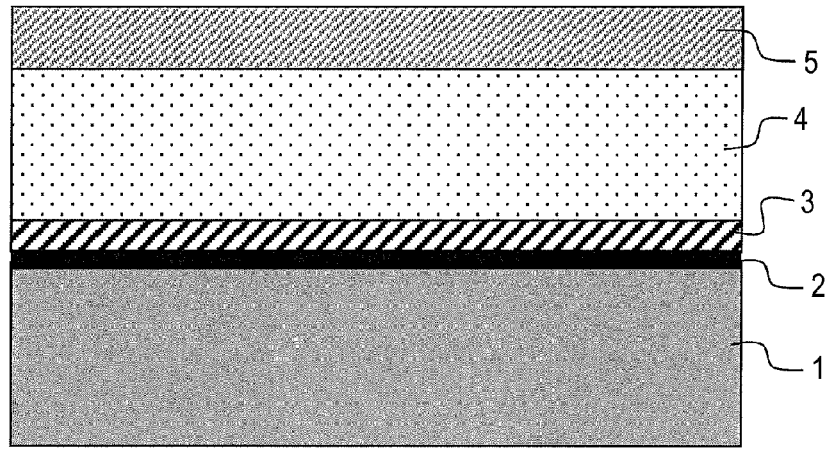
FIGS. 1A and 1B are each a process diagram (Part 1) showing a method for manufacturing a semiconductor device according to an embodiment of the present invention.

First of all, as shown in FIG. 1A, a gate insulating film 2, a first dummy gate section 3 and a second dummy gate section 4 are formed and stacked in this order on a semiconductor substrate 1, and a hard mask film 5 is then formed and stacked on the second dummy gate section 4.

As one example, a silicon substrate is used as the semiconductor substrate 1. The gate insulating film 2 is formed (fabricated) as a high dielectric constant gate insulating film on the upper surface of the semiconductor substrate 1 by using a high dielectric constant material (high-k material), for example, hafnium oxide ($HfO_2$), etc. for a fabricating material. The first dummy gate section 3 is formed (fabricated) in a thickness thicker than that of the gate insulating film 2 in a state of covering the gate insulating film 2 on the semiconductor substrate 1. The second dummy gate section 4 is formed (fabricated) in a thickness thicker than that of the first dummy gate section 3 in a state of covering the first dummy gate section 3 on the semiconductor substrate 1. The second dummy gate section 4 is formed by using, for example, polysilicon. The first dummy gate section 3 is formed by using a metal material which is not reactive with polysilicon and has high heat resistance, for example, titanium nitride (TiN), etc. The hard mask film 5 is formed by using, for example, silicon oxide ($SiO_2$), silicon nitride (SiN), etc. The hard mask film 5 may be formed as the need arises.

Figure 1B:
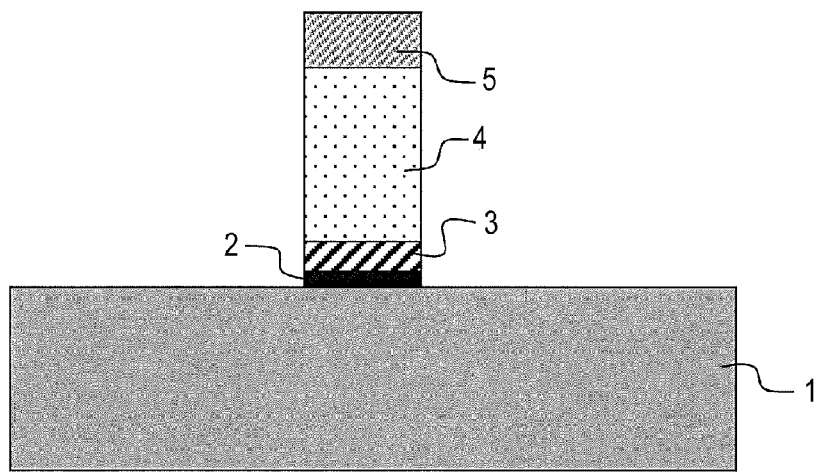

Subsequently, a non-illustrated resist mask is formed on the hard mask film 5 by using a photolithography technology and an etching technology; and the gate insulating film 2, the first dummy gate section 3, the second dummy gate section 4 and the hard mask film 5 are processed into a previously set pattern by means of etching using this resist mask for an etching mask. According to this, as shown in FIG. 1B, the gate insulating film 2, the first dummy gate section 3, the second dummy gate section 4 and the hard mask film 5 are processed in the same pattern shape with the same width in the gate length direction X on the semiconductor substrate 1. The pattern shape is determined by a design of the transistor.

Figure 2A:
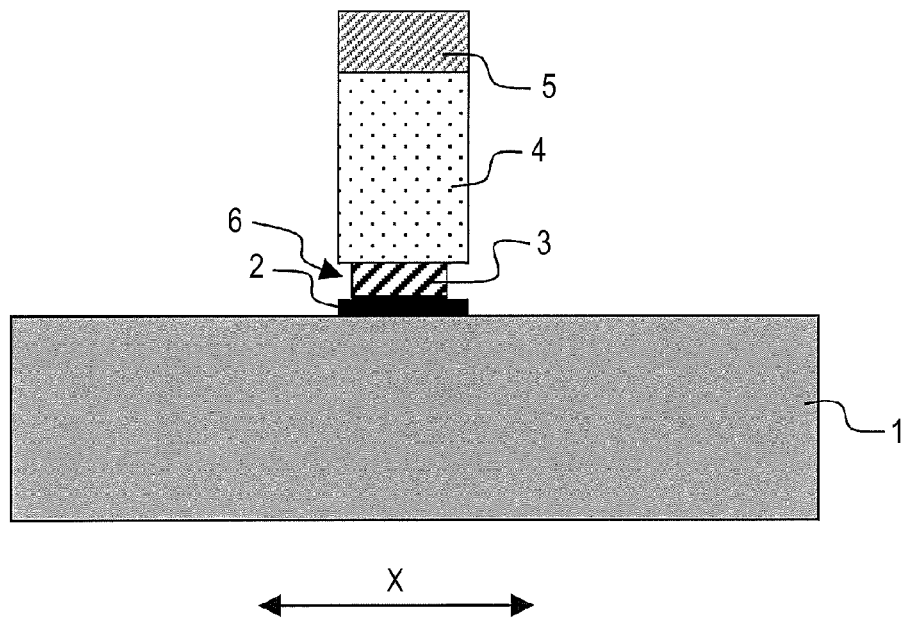
FIGS. 2A and 2B are each a process diagram (Part 2) showing a method for manufacturing a semiconductor device according to an embodiment of the present invention.

Subsequently, as shown in FIG. 2A, the first dummy gate section 3 is made to move back in the gate length direction X relative to the second dummy gate section 4, thereby forming a notch section 6. The formation of the notch section 6 is carried out by using, for example, a wet etching technology. In this wet etching, the notch section 6 is formed by selectively etching the first dummy gate section 3. Specifically, for example, in the case where the first dummy gate section 3 is made of titanium nitride, the formation is carried out by wet etching using an amine based organic chemical solution as an etching solution. According to this, the first dummy gate section 3 made of titanium nitride is etched while inhibiting etching of the second dummy gate section 4 made of polysilicon. For that reason, the notch section 6 can be formed in a state in which the side surface of the first dummy gate section 3 is made to move back in the gate length direction by, for example, from about 5 to 15 nm relative to the side surface of the second dummy gate section 4.

Figure 2B:
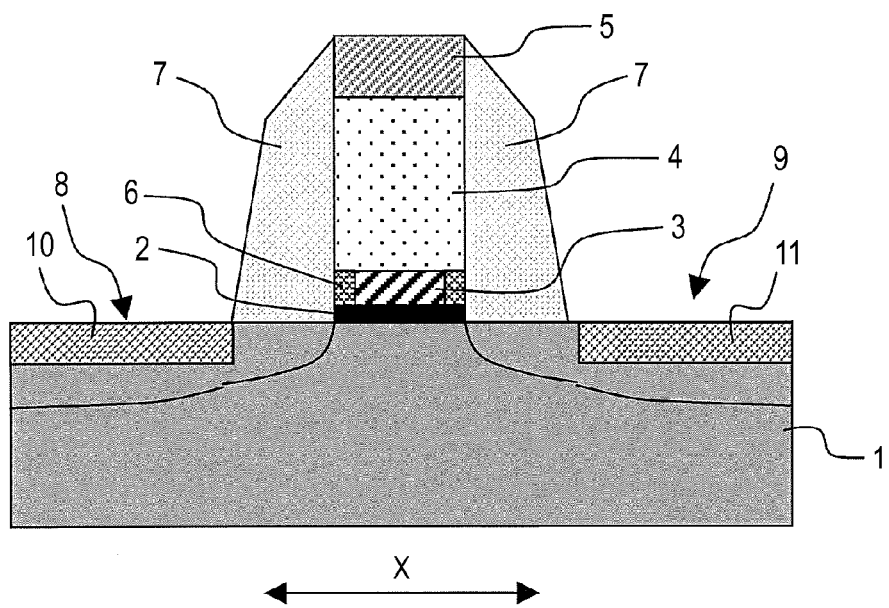

Subsequently, as shown in FIG. 2B, similar to a well-known CMOS process, an extension region and a hollow region are formed in the semiconductor substrate 1 by means of ion implantation, and a side wall 7 is then formed in a side part of each of the gate insulating film 2, the first dummy gate section 3 and the second dummy gate section 4. The formation of the side wall 7 is carried out by using an insulating material. On that occasion, the notch section 6 is embedded with the insulating material which forms the side wall 7. The side wall 7 is formed by using an insulating material, for example, silicon oxide, silicon nitride, etc. The side wall 7 may be formed as a single layer or two or more layers.

Subsequently, impurities are introduced into the semiconductor substrate 1 by means of ion implantation using the side wall 7 as a mask, thereby forming source/drain regions 8 and 9, and an annealing treatment (for example, laser annealing) or the like is then carried out for the purpose of activating the impurity ions. Thereafter, silicide layers 10 and 11 with low electrical resistance are formed in the source/drain regions 8 and 9, respectively by a salicide technology using cobalt (Co), nickel (Ni), etc.

Figure 3A:
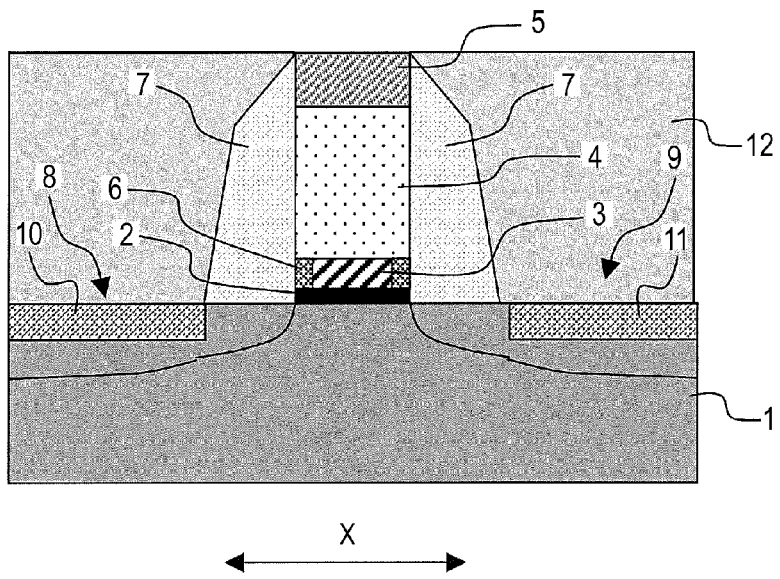
FIGS. 3A and 3B are each a process diagram (Part 3) showing a method for manufacturing a semiconductor device according to an embodiment of the present invention.

Subsequently, as shown in FIG. 3A, an interlayer insulating film 12 is formed on the semiconductor substrate 1 in a state of covering the hard mask film 5, the wide wall 7 and the silicide layers 10 and 11, and the upper surface of the hard mask film 5 is then exposed by means of flattening processing using, for example, a CMP (chemical mechanical polishing) technology. At that time, the upper surface of the second dummy gate section 4 may be exposed by completely removing the hard mask film 5 by a CMP technology.

Figure 3B:
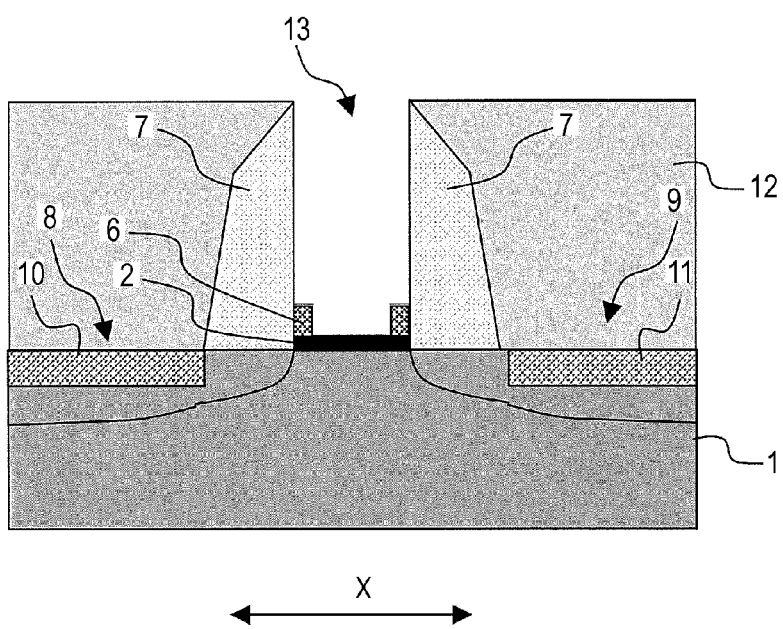

Subsequently, as shown in FIG. 3B, the hard mask layer 5, the second dummy gate section 4 and the first dummy gate section 5 are removed by using a dry etching technology and a wet etching technology, and the gate insulating film 2 and the notch section 6 are left in the bottom of a removed portion 13 thereof. At that time, there is produced a state in which the inner surface of the side wall 7 is exposed in the removed portion 13. For that reason, an aspect ratio at the time of embedding an electrode is low as compared with the case where the inner surface of the side wall is covered by the gate insulating film. Accordingly, embedding properties in embedding the removed portion 13 with a conductive material in a post step can be enhanced. Also, the notch section 6 made of an insulating material remains on the gate insulating film 2 in the gate length direction X in the bottom of the removed portion 13 in a state of covering a part of the gate insulating film 2 and exposing other part of the gate insulating film 2. Also, the notch section 6 remains in a rectangular corner portion formed between each of the wide walls 7 facing each other in the gate length direction X and the gate insulating film 2 in a state of coming into contact with the both (2 and 7).

Figure 4A:
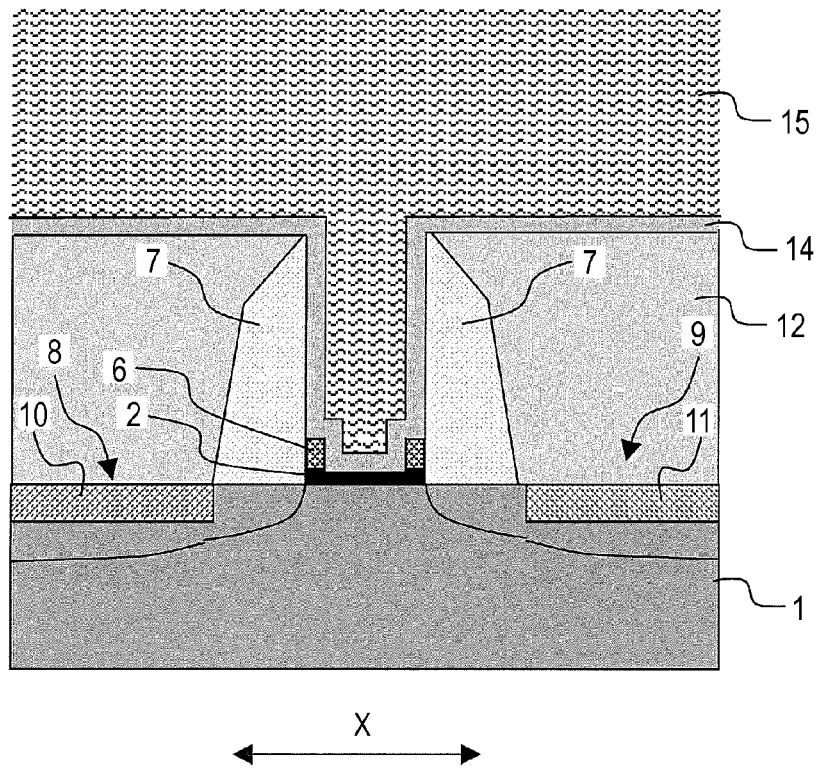
FIGS. 4A and 4B are each a process diagram (Part 4) showing a method for manufacturing a semiconductor device according to an embodiment of the present invention.

Subsequently, as shown in FIG. 4A, a first metal layer 14 and a second metal layer 15 are fabricated in this order on the interlayer insulating film 12 in a state of embedding the removed portion 13 by using, for example, a CVD (chemical vapor deposition), ALD (atomic layer deposition), sputtering or plating technology. At that time, the first metal layer 14 is formed (fabricated) in a state of covering the inner surface of the side wall 7 exposed in the removed portion 13 as well as the gate insulating film 2 remaining in the removed portion 13 and the surface of the notch section 6 (surface exposed in the removed portion 13). Because of necessity for changing a work function of a gate electrode between nMOS and pMOS, the first metal layer 14 is formed as a metal layer for controlling the work function (work function controlling metal layer). The second metal layer 15 is formed as a metal layer for embedding the removed portion 13 (embedding metal layer).

In the first metal layer 14, the following materials are useful as a conductive material. That is, in the case of nMOS, metal materials, for example, La (lanthanum), Er (erbium), Y (yttrium), Yb (ytterbium), Zn (zinc), Sc (scandium), Pb (lead), Mg (magnesium), Mn (manganese), Al (aluminum), Hf (hafnium), Ta (tantalum), Ti (titanium), Zr (zirconium), V (vanadium), etc.; silicide films, silicon nitride films and carbide films containing such a metal material; and alloys containing two or more kinds of such a metal material are useful. On the other hand, in the case of PMOS, metal materials, for example, Ti (titanium), Ta (tantalum), Ru (ruthenium), Pr (praseodymium), Pt (platinum), Mo (molybdenum), W (tungsten), Ni (nickel), Co (cobalt), Cr (chromium), Re (rhenium), Rh (rhodium), Pb (lead), etc.; silicide films, silicon nitride films and carbide films containing such a metal material; and alloys containing two or more kinds of such a metal material are useful. The structure of the first metal layer 14 is not limited to a single layered structure but may be of a stacked structure of two or more layers. In the second metal layer 15, a metal material, for example, W (tungsten), Al (aluminum), Cu (copper), etc. or an alloy containing such a metal material is useful as a conductive material.

Figure 4B:
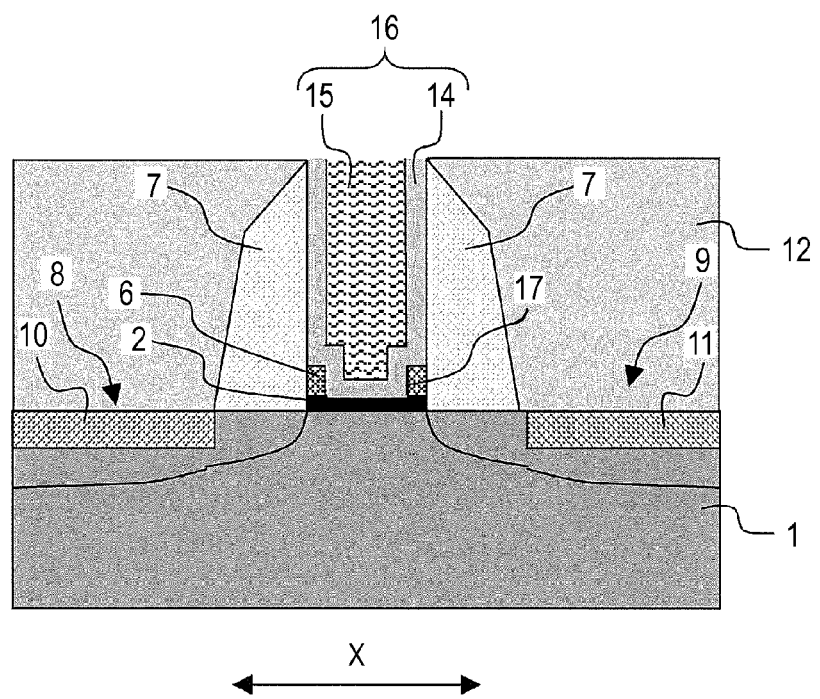

Subsequently, as shown in FIG. 4B, the excessive conductive material (metal material) stacked on the interlayer insulating film 12 is removed by using, for example, a CMP technology, thereby forming a gate electrode 16. This gate structure is a dual metal gate structure because the gate electrode 16 is formed of the first metal layer 14 and the second metal layer 15. Also, the gate electrode 16 is formed as a metal gate electrode.

A semiconductor device obtained by such a manufacturing method has the following configuration. That is, such a semiconductor device is provided with the gate insulating film 2 formed on the semiconductor substrate 1, the gate electrode 16 formed on the gate insulating film 2 and the side wall 7 formed in a side part of the gate electrode 16. The gate insulating film 2 is a high dielectric constant gate insulating film in view of the fact that a high dielectric constant material is used as its fabricating material. The gate electrode 16 is a metal gate electrode in view of the fact that a metal material is used as its electrode material. Also, the gate insulating film 2 is formed beneath the gate electrode 16 in the same width as a gap between the side walls 7 facing each other in the gate length direction X so as to interpose the gate electrode 16 therebetween. Also, the gate electrode 16 has a restricted section 17 (see FIG. 4B) which is narrower than the gap between the side walls 7 in the gate length direction in a lower end section of the gate electrode 16. The restricted section 17 refers to a portion where the diameter of the gate electrode 16 is reduced in the gate length direction X in the lower end section of the gate electrode 16. For that reason, the gate electrode 16 comes into contact with the gate insulating film 2 in the same width as the restricted section 17. Also, the notch section 6 in a state in which it is embedded with an insulating material is provided in a portion excluding the restricted section 17 of the gate electrode 16 (portion interposing the restricted section 17 in the gate length direction X) on the gate insulating film 2. For that reason, the restricted section 17 of the gate electrode 16 is diameter-reduced in the gate length direction X due to the presence of the notch section 6.

The gate insulating film 2 exists only beneath the gate electrode 16 and does not exist at the boundary between the gate electrode 16 and the side wall 7. For that reason, there is produced a state in which the gate electrode 16 comes into contact with the notch section 6 and the gate insulating film 2 in a lower end section thereof and comes into contact with the side wall 7 in an upper part relative to the former. Accordingly, the fringe capacity and gate resistance of a transistor are low as compared with the case of forming a gate insulating film over from a lower part to a side part of the gate electrode. Also, the electrical connection between the gate electrode 16 and the gate insulating film 2 is effected by the contact between the restricted section 17 and the gate insulating film 2. Accordingly, the effective gate length of a MOS transistor becomes short corresponding to a diameter-reduced portion in the restricted section 17 due to the presence of the notch section 6. According to this, in applying the gate-last process, not only reduction of the fringe capacity and gate resistance of a transistor but shortening of the effective gate length can be realized. Also, by shortening the gate length, it is possible to contrive to enhance characteristics of a transistor (for example, realization of high speed or low power consumption, etc.).

In the foregoing embodiment, while the case where the gate insulating film 2, the first dummy gate section 3, the second dummy gate section 4 and the hard mask film 5 are pattern processed, and the notch section 6 is then formed by using a wet etching technology has been exemplified, it should not be construed that the present invention is limited thereto. That is, the notch section 6 may be formed by using a dry etching technology. Specifically, in the case of pattern processing the gate insulating film 2, the first dummy gate section 3, the second dummy gate section 4 and the hard mask film 5, the second dummy gate section 4 is anisotropically etched, and the first dummy gate section 3 is then isotropically etched, thereby forming the notch section 6. As an etching condition of the first dummy gate section 3, for example, in the case of forming the first dummy gate section 3 using titanium nitride, a bias electric power is lowered by using an $SF_6$ based or Cl based gas as an etching gas for dry etching, and a processing condition with isotropy is applied. According to this, the side etching amount becomes relatively low at the time of etching the second dummy gate section 4, whereas the side etching amount becomes relatively high at the time of etching the first dummy gate section 3. For that reason, it is possible to make the first dummy gate section 3 move back in the gate length direction X relative to the second dummy gate section 4, thereby forming the notch section 6 in the portion where the first dummy gate section 3 has moved back.

The present application contains subject matter related to that disclosed in Japanese Priority Patent Application JP filed in the Japan Patent Office on Jul. 9, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a semiconductor device comprising:
   successively forming, a gate insulating film, a first dummy gate section and a second dummy gate section stacked in this order;
   removing a portion of the first dummy gate section that is located directly beneath outer sides of the second dummy gate section to form a notch section;
   forming a side wall made of an insulating material at a side part of each of the gate insulating film, the first dummy gate section and the second dummy gate section and filling the notch section with the insulating material;
   removing the first dummy gate section and the second dummy gate section to leave the gate insulating film and the insulating material filled into the notch section located on outer sides of the gate insulating film;
   forming a gate electrode made of a conductive material by embedding the removed portion with the conductive material; and
   wherein at least portions of the sidewall directly contacts the gate electrode.

2. The method for manufacturing a semiconductor device according to claim 1, wherein
   the gate insulating film is formed as a high dielectric constant gate insulating film, and
   the gate electrode is formed as a metal gate electrode.

3. The method for manufacturing a semiconductor device according to claim 1 or 2, wherein
   the first dummy gate section and the second dummy gate section are pattern processed, and the first dummy gate section is then selectively etched to form the notch section.

4. The method for manufacturing a semiconductor device according to claim 1 or 2, wherein
   when the first dummy gate section and the second dummy gate section are pattern processed, the second dummy gate section is anisotropically etched, and the first dummy gate section is then isotropically etched to form the notch section.

5. A semiconductor device comprising:
   a gate insulating film having a top surface;
   a gate electrode located on the top surface of the gate insulating film; and
   a side wall formed in contact with the gate electrode at a side part of the gate electrode, wherein
   the gate insulating film is formed a same width as a widest portion of the gate electrode;
   the gate electrode has a restricted section which is narrower than the widest portion of the gate electrode and which contacts the gate insulating film;
   the side wall includes a protruding region adjacent the restricted section of the gate electrode embedded with an insulating material; and wherein the protruding region is in contact with the top surface of the gate insulating film.

6. The semiconductor device according to claim 5, having a region adjacent the restricted section of the gate electrode embedded with an insulating material on the gate insulating film.

7. The semiconductor device according to claim 5 or 6, wherein
   the gate insulating film is composed of a high dielectric constant gate insulating film, and
   the gate electrode is composed of a metal gate electrode.

8. The semiconductor device according to claim 5, wherein the sidewall directly contacts the gate electrode.

* * * * *